(12) United States Patent
Menschig et al.

(10) Patent No.: US 6,521,068 B1
(45) Date of Patent: Feb. 18, 2003

(54) METHOD AND DEVICE FOR DETACHING A SEGMENT OF A MATERIAL LAYER

(75) Inventors: Arnd Menschig, Bachstrasse 41, 71093 Weil im Schoenbuch (DE); Ralf Baehnisch, Stuttgart (DE); Bernd Huettner, Korntal (DE)

(73) Assignee: Arnd Menschig, Weil Im Schoenbuch (DE)

( * ) Notice: Subject to any disclaimer, the term of this patent is extended or adjusted under 35 U.S.C. 154(b) by 64 days.

(21) Appl. No.: 09/607,191

(22) Filed: Jun. 28, 2000

Related U.S. Application Data (63) Continuation of application No. PCT/EP99/08180, filed on Oct. 28, 1999.

(30) Foreign Application Priority Data

Oct. 29, 1998 (DE) .......................................... 198 49 658

(51) Int. Cl.$^7$ ............................................... B32B 31/28

(52) U.S. Cl. .......................... 156/83; 156/233; 156/234; 156/272.8; 156/344; 219/121.6; 427/597

(58) Field of Search .......................... 156/83, 150, 233, 156/234, 272.8, 344; 219/121.6, 121.67, 121.68, 121.69, 121.7, 121.71, 121.72; 427/597, 422

(56) References Cited

U.S. PATENT DOCUMENTS

| | | |
|---|---|---|
| 4,970,196 A | 11/1990 | Kim et al. |
| 5,296,674 A | 3/1994 | Praschek et al. |
| 5,725,706 A | 3/1998 | Thoma et al. |
| 5,736,464 A | 4/1998 | Opower |
| 6,159,832 A * | 12/2000 | Mayer .......................... 427/597 |

FOREIGN PATENT DOCUMENTS

DE      198 23 196      10/2000

OTHER PUBLICATIONS

Zergioti, I., et al., "Microdeposition of metals by femtosecond excimer laser", Applied Surface Science, vol. 127–129, May 1998, pp. 601–605.

Ihlemann, J., et al., "Excimer laser micro machining of inorganic dielectrics", Applied Surface Science, vol. 106, Oct. 1996, pp. 282–286.

Evans, R., et al., "Investigation of a laser–produced atomic beam", Journal of Physics D: Applied Physics, vol. 27, No. 3, Mar. 1994, IOP Publishing,, Bristol, GB, pp. 452–558.

Miotello, A., et al., "Critical assessment of thermal models for laser sputtering at high fluences", Applied Physics Letters, vol. 67, Dec. 11, 1995, pp. 3535–3537.*

* cited by examiner

Primary Examiner—Michael W. Ball
Assistant Examiner—John T. Haran
(74) Attorney, Agent, or Firm—Barry R. Lipsitz (57) ABSTRACT

For the purpose of producing a method for detaching a segment—disposed on a carrier—from a material layer extending in a layer plane and having a specific layer thickness, by means of a laser pulse passing through the carrier in such a way as to detach segments from a material layer with as little thermal stress and as few thermal secondary effects as possible, it is proposed that the laser pulse within a segment layer-component volume butting against the carrier, the said layer-component volume lying in the plane of the layer within an extent of the beam cross-section of the laser pulse and extending transversely to the layer plane via a part of the layer thickness, produces superheated matter of a density similar to the solid state in a state of thermodynamic non-equilibrium and in particular at a temperature above the critical temperature, and that a cohesive, solid partial layer remains in the segment on the side of the layer-component volume opposite to the carrier, the said partial layer being urged away from the carrier by the superheated matter.

28 Claims, 12 Drawing Sheets

METHOD AND DEVICE FOR DETACHING A SEGMENT OF A MATERIAL LAYER

This is a Continuation of PCT/EP99/08180 filed Oct. 28, 1999.

The invention relates to a method of detaching a segment disposed on a carrier from a material layer extending in a layer plane and having a specific layer thickness, by means of a laser pulse passing through the carrier.

A method of this type known from DE 196 40 594 provides for the layer disposed directly on the carrier being destroyed as such by the effect of light and detachment of the segment therefore occurring as a result of the destruction.

The destruction of part of the material layer or of a layer specially provided for the purpose application takes place with a relatively long time scale of the order of nanoseconds with the result that in the end the entire layer is heated up and also that the segment is detached with an insufficiently precise boundary surface.

The so-called LIFT processes work in a similar fashion, producing even large quantities of molten material, which give rise to material contamination around the region to be detached and are especially undesirable in microtechnology.

The objective of the invention is therefore to detach segments from a material layer with as little thermal stress and as few thermal side effects as possible.

In a method of the type described in the introduction, this objective is achieved according to the invention in that the laser pulse within a partial layer volume of the segment—the said partial layer volume butting against the carrier, lying in the plane of the layer within an extent of the beam cross-section of the laser pulse and extending transversely to the layer plane via a part of the layer thickness—produces superheated matter in a state of thermodynamic non-equilibrium and of a density similar to the solid state and in that a cohesive, solid partial layer remains in the segment on the side of the partial layer volume opposite to the carrier, the said partial layer being urged away from the carrier by the superheated matter.

The advantage of the solution according to the invention is observable in that, as a result of the specially produced superheated matter in a state of thermodynamic non-equilibrium, instead of the conventional evaporation process of the material, a so-called explosive evaporation now occurs, which on the one hand produces a very high pressure consequently causing marked acceleration during detachment of the cohesive, solid partial layer which, for example, permits precise detachment of the segment from the layer and which on the other hand, on account of the short time duration, avoids thermal stressing of the cohesive, solid partial layer forming the segment. The result of this is that, with the method according to the invention, on the one hand large forces of acceleration are available for the cohesive, solid partial layer, the acceleration forces furthermore being combined with the fact that, on account of the explosive evaporation, the cohesive, solid partial layer undergoes far less thermal stress than with the known method, with the result that here the adverse thermal secondary effects are substantially eliminated.

In particular in the solution according to the invention, a highly excited non-thermodynamic state is achieved with ultra-short laser pulses, in which arrangement the electron temperature may far exceed that of the phonones. The stored energy is transferred from the electrons to the phonone system with a characteristic material-dependent time, for example of the order of magnitude between 50 femtoseconds and 2 picoseconds, in a volume which is determined by the extent of the partial layer volume in the plane of the layer and the extent of the partial layer volume transversely to it, due to the thermal penetration depth of the electrons which, for example at a pulse duration of 100 femtoseconds, is of the order of magnitude of 50 nm. Thus the phonone system can be heated extremely rapidly to a zone above the critical temperature without a conventional evaporation process taking place.

In particular, the high pressure briefly arising due to the explosive evaporation brings about the already described greater acceleration of the cohesive, solid partial layer, which is also responsible for the fact that the thermal stressing of the material is less in the cohesive, solid partial layer.

In an embodiment of the method according to the invention, superheated matter is preferably in the state of thermodynamic non-equilibrium at a temperature above the critical temperature.

Advantageously, the superheated matter according to the invention is producible only with laser pulses, the pulse duration of which is less than 100 picoseconds and the pulse duration of which is so short that it impossible to establish a thermodynamic equilibrium.

In the solution according to the invention, it is especially advantageous if, at least at the beginning, the material of the material layer is present in the superheated matter substantially unchanged and the matter thus simply possesses more energy than before the action of the laser pulse but does not itself change for example chemically.

In the method according to the invention, it is furthermore advantageous if the superheated matter from material of the material layer expands substantially stoichiometrically during detachment of the segment, i.e. that the material composition does not change during expansion of the superheated matter and thus no contaminants occur due to degrading material, with the result that in particular the arising cohesive, solid partial layer, which is detached from the carrier, is not contaminated with constituents resulting from degradation of the superheated matter and thus from non-stoichiometric expansion.

In an embodiment according to the invention, it is furthermore advantageous if the storage of energy in the superheated matter takes place in the electron system only until thermal losses occur.

As regards the description of the method according to the invention, so far it has merely been assumed that at least one laser pulse is necessary. It is especially advantageous if detachment of the segment is performed with a single laser pulse.

Especially great accelerations of the cohesive, solid partial layer can then be achieved if the cohesive, solid partial layer is accelerated away from the carrier by hydrodynamic expansion of the superheated matter in the partial layer volume. An extremely precise tearing of the cohesive, solid partial layer from the surrounding layer is hereby achievable, especially when the segment is still connected with the surrounding layer.

In a large number of applications it is sufficient to detach, i.e. for example to lift off, from the carrier only the cohesive, solid partial layer as a segment from the layer.

However, it is especially advantageous if the cohesive, solid partial layer is accelerated in the direction of a substrate. Here in particular the solution according to the invention lends itself as especially suitable since, by comparison with the state of the art, it is capable of exposing the cohesive, solid partial layer to large forces of acceleration and thus of moving it on to a substrate with great precision.

In this solution it is especially advantageous if the cohesive, solid partial layer is fixed on the substrate, it being possible for this purpose to prepare the substrate for receiving the cohesive, solid partial layer in such a way that adhesion contributes to the fixing.

However, it is especially advantageous if the energy of impact of the cohesive, solid partial layer on the substrate leads to adequate fixing on the latter. Here too, in particular the solution according to the invention can be used highly advantageously since, on account of the large forces of acceleration, it is predestined for fixing the cohesive, solid partial layer on the substrate by means of its impact energy.

The fixing takes place for example in the form of a so-called "cold bonding" of the cohesive, solid partial layer with the substrate.

In this arrangement the substrate is advantageously positioned at a distance from the carrier at which impact-determined fixing of the cohesive, solid partial layer on the substrate occurs.

It is also especially advantageous if the size of the beam cross-section is selected so that the impact energy leads to adequate fixing on the substrate.

It is also similarly advantageous if the energy of the laser pulse is selected so that the impact energy leads to adequate fixing on the substrate.

Another advantageous solution provides for the pulse duration of the laser pulse being selected so that the impact energy leads to adequate fixing on the substrate.

However, as an alternative to deposition of the cohesive, solid partial layer it is also similarly conceivable for the cohesive, solid partial layer to be detached by detaching means at the time of its detachment from the carrier, with the result that no movement of the cohesive, solid partial layer from the carrier on to the substrate is necessary over considerable distances.

As regards the pulse duration of the laser pulse, no detailed information has so far been given. It is therefore especially advantageous if the pulse duration of the laser pulse is determined in such a way that the partial layer volume extends transversely to the plane of the layer over a thermal penetration depth of electrons heated during the pulse duration of the laser pulse.

An especially advantageous solution provides for the pulse duration of the laser pulse being smaller than the material-dependent thermal relaxation time of electrons of the material, with the result that an extremely rapid and efficient heating of the matter in the partial layer volume, and therefore minimal thermal stressing of the cohesive, solid partial layer to be detached, are possible.

In this arrangement, according to the invention the pulse duration may be constant as observed over the beam cross section may be constant or it may vary over the beam cross section.

Especially advantageous pulse durations are shorter than 50 picoseconds, even better shorter than 20 picoseconds.

As regards the materials to be used for the material layer in the method according to the invention, an extremely wide range of solutions is conceivable.

One advantageous solution provides for the material layer being selected so that the laser pulse couples to free electrons of the material.

Another solution provides for the material layer being selected so that the laser pulse itself produces the electrons necessary for coupling by means of multiple photon absorption in the material layer.

A further solution provides for the material layer being selected so that the laser pulse itself produces the electrons necessary for coupling by means of an avalanche breakdown in the material layer.

In respect of the distribution of the energy density in the laser pulse, no detailed information has been given in connection with the above description of the individual embodiments. Thus, for example, the energy density in the beam cross-section could exhibit a Gaussian distribution.

However, in connection with the solution according to the invention it is especially advantageous if the local energy density within a core region of the beam cross-section exhibits values of the same order of magnitude, i.e. that the local energy density within the beam cross-section varies less with a Gaussian distribution.

It is especially advantageous if the energy density values within the core region of the beam cross-section show a substantially flat course.

A profile such as this is for example described as a so-called hat-top profile.

In such a course of the energy density within the core region, the energy density outside the core region is preferably substantially lower, but similarly substantially of equal magnitude.

An especially advantageous solution provides for the values of the energy density of the laser pulse in a marginal region outside the core region of the beam cross-section being higher than the values within the core region. With this there is the possibility of achieving a substantially constant energy uptake of matter within the partial layer volume corresponding to the core region, and of designing the energy uptake in a partial layer volume marginal region corresponding to the marginal region of the beam cross-section to be even more strong, which is advantageous especially when the segment is to be detached from the surrounding layer since in this way the detachment can be improved and rendered precise along a tear line around the segment.

In this arrangement it would also suffice to increase the energy density at individual points outside the core region. It is especially advantageous, however, if the values of the energy density in the marginal region around the whole core region are elevated by comparison with the core region, so that the core region is surrounded by a substantially closed marginal region of elevated energy density and thus the detachment of the segment from the layer can be achieved especially advantageously.

As an alternative to detachment of the segment from the surrounding layer, within the framework of the solution according to the invention in the variants previously described it is also conceivable to pre-structure the segment. This means that the layer thickness of the material layer around the segment is already reduced before impingement of the laser pulse. In this arrangement the reduction may be over the whole layer thickness, but it may also only extend over a part of the layer thickness. In all cases pre-structuring has the advantage that the external contour of the resulting segment can be defined even more precisely and that even after detachment of the cohesive, solid partial layer, the external contour exhibits the desired, precise shape whereas, without pre-structuring of the external contour, there is always uncertainty because, for example due to energy-density inhomogeneities in the laser beam or inhomogeneities in the material layer itself, the external contour of the segment deviates so far from the desired shape that this is undesirable and for example reduces the possible applications of the segment or renders its use impossible in a particular case.

Moreover, an especially advantageous embodiment of the method according to the invention provides for the partial layer being permanently deformed by a defined variation of the individual regions of the partial layer volume by energy supplied by the laser pulse.

In this arrangement, the energy supplied by the laser pulse can be varied either in that the energy density of the laser pulse varies over the cross-section of the beam and thus variably large quantities of energy are supplied to individual regions of the partial layer volume, or also through time variation of the action of the laser pulse on the individual regions of the partial layer volume, with the result that a variation of the quantities of energy supplied to these individual regions is also possible by this means.

Here, deformation of the partial layer must be understood as a shaping of the type which results in a deviation from the shape of the partial layer prior to the action of the laser pulse on the carrier.

This kind of deformation of the partial layer can now be utilised advantageously in various ways.

For example, an advantageous solution provides for the partial layer being deposited on the substrate as a permanently formed component.

This is advantageous for example in cases when the partial layer is to be laid out fully on an uneven surface, with the result that, due to a deformation corresponding to the shape of the uneven surface, an improved full laying out or even fixing is achievable.

This arrangement preferably provides for this permanently formed component being used on the substrate as a functional structural component.

A very wide range of possible uses are conceivable as functional parts of this type.

For example, a permanently formed component of this type may be used variously as an electrical functional member, for example as a ladder bridge, as part of a capacitor, as part of a spring contact, or as part of a switch in micro switches, especially in micro-system technology.

Alternatively or in addition thereto, a permanently formed component of this type may however also be used as a mechanical part, for example as a spacer or spring in micro-system technology.

Especially advantageously, the method according to the invention can be utilised when—as is the case in particular with functional parts—the partial layer is fixed to the substrate only with a partial region and the rest of the partial region therefore stands away from the substrate and so various functions can be fulfilled by means of this separated partial region.

In addition, the objective cited in the introduction is also achieved according to the invention by a device for detaching a segment from a material layer extending in a plane of the layer and having a specific layer thickness, the said segment being disposed on the carrier, the said device comprising a holder for positioning the carrier, a laser system for producing individual laser pulses and a beam-guide lens system, which allows a laser pulse to pass through the carrier for the purpose of detaching the segment, in that the laser pulse within a partial layer volume of the segment—the said partial layer volume butting against the carrier, lying in the plane of the layer within an extent of the beam cross-section of the laser pulse and extending transversely to the layer plane via a part of the layer thickness—produces superheated matter of a density similar to the solid state, in a state of thermodynamic non-equilibrium and in particular at a temperature above the critical temperature, and in that a cohesive, solid partial layer remains in the segment on the side of the partial layer volume opposite to the carrier, the said cohesive, solid partial layer being accelerable by the superheated matter.

Further advantageous embodiments of the device according to the invention arise in correspondence with the advantageous embodiments of the method according to the invention which are described in detail.

The method and devices according to the invention are particularly suitable for manufacturing miniaturised structural assemblies in which the manufacture of structured surfaces is necessary. Thin metallic layers, semiconducting layers, superconducting layers, ceramic layers and insulating layers or layers of organic substances with depressions, troughs or ridges within the micrometric range often have to be manufactured for this.

The applications in semiconductor technology are found, for example, in the secondary processing of mass-produced goods. One example of use is the flexible circuitry of electrode matrices (free programmable gate arrays), or the balancing of parameters such as for example the balancing of resistances and oscillation frequencies. Other possible uses are found in the repair of complex switching circuits or of lithographic masks, in the client-specific manufacture and modification of structural members such as e.g. ASICS, and in the prototype development of structural members.

A further application is found quite generally in the detachment of structural components or structural assemblies from carrier materials following their isolation. Applications for die bonding and flip-chip bonding are of especial interest here.

An especially advantageous variant of the device according to the invention provides for different quantities of energy being suppliable with the laser pulse to the different regions of the partial layer volume, the partial layer being permanently deformable by the different quantities of energy.

Here it is especially advantageous if the partial layer is placeable on a substrate as a component and thus preferably represents a functional member.

Further features and advantages of the invention are the subject of the following description and of the graphic representation of a few embodiments of the solution according to the invention.

Figure 1:
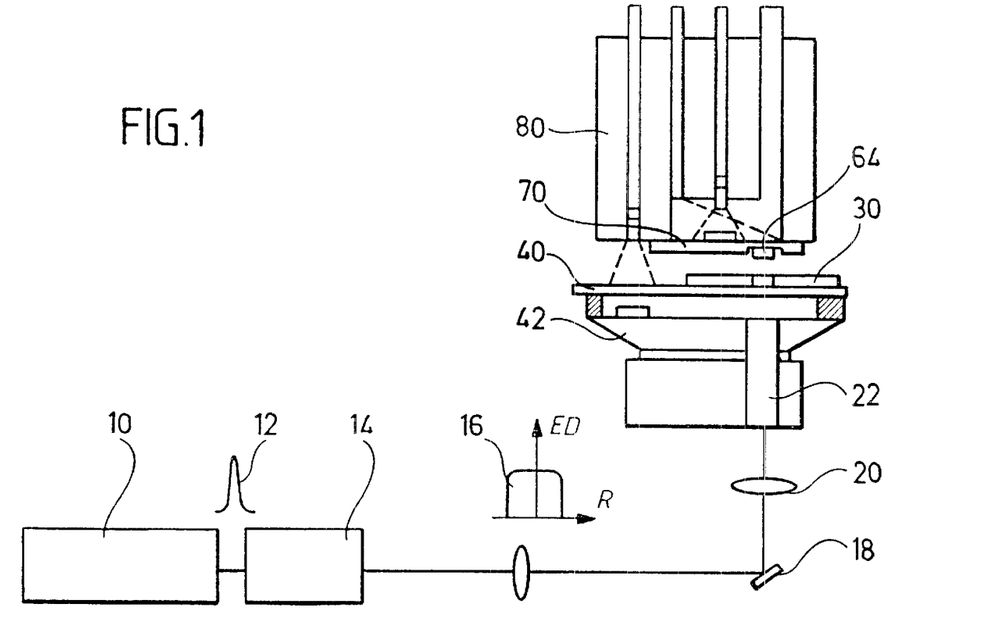
FIG. 1 A diagrammatic representation of a first embodiment of a device according to the invention for performing the method.

A first embodiment of a system according to the invention, represented in FIG. 1, comprises a laser 10, which produces laser pulses 12, the pulse duration of which is preferably shorter than 50 picoseconds. The laser pulses 12 pass through a beam-forming lens designated overall with the reference number 14, to produce a laser pulse 16 intended for the removal of material, the said laser pulse 16 having an energy density ED distribution which is spatially predetermined relative to a radial direction R of the beam.

The laser pulse 16 is focused on to a material layer 30 by a deflecting optical device 18 and a lens 20 via an opening 22 in a holder 42, the said material layer being disposed on a carrier 40, the carrier being for example disposed on a holder 42 and in a position defined relative thereto, and the holder being perforated by the opening 20 and thus for its part in a position defined relative to the opening 22.

Figure 2:
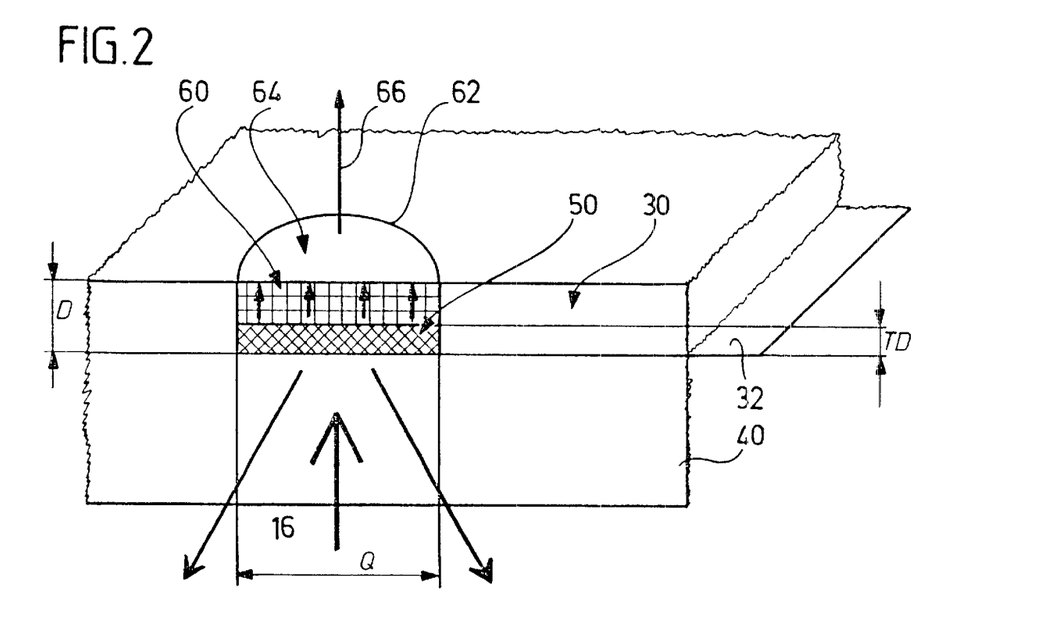
FIG. 2 A diagrammatic representation of the formation of superheated matter in a layer of material corresponding to the method according to the invention.

As shown in FIG. 2, the laser pulse 16, represented by an arrow in FIG. 2, first of all penetrates the carrier 40 transparent to the laser pulse 16 and after penetrating the carrier 40 impinges upon the layer 30. The laser pulse 16 here has a defined beam cross-section Q with which it heats a partial layer volume which is marked by cross-hatching in FIG. 2 and which, in the direction of a layer plane 32, exhibits an extension corresponding approximately to the cross-section Q of the laser beam 16 and, transversely to the layer plane 32, extending into the layer 30 via a partial layer thickness TD, which is a fraction of the layer thickness D of the layer 30.

Within the partial layer volume 50, during the action of the laser pulse 16, the material of layer 30 contained therein is heated in such a way that superheated matter in a state of thermodynamic non-equilibrium and of a density similar to the solid state arises at a temperature above the critical temperature. The superheated matter is obtainable in particular by heating of the electrons of the material of the layer 30; the electrons are heated on impingement of the laser beam 16 in a region of the partial layer volume 50 which is covered by the beam cross-section Q and then, during the pulse duration of the laser pulse, penetrate further into the layer 30 with a penetration density TD with the result that the penetration depth TD ultimately defines the thickness TD of the partial layer volume 50.

However, the action duration of the laser pulse 16 in the partial layer volume for producing the superheated matter is so short that a solid, cohesive partial layer 60 of the material of the layer 30 remains on a side of the partial layer volume 50 opposite to the carrier 40, the said partial layer 60 tearing away from the surrounding layer 30 along a tear line 62 on account of hydrodynamic expansion of the superheated matter in the partial layer volume 50, and is thus accelerated away from the carrier 40 in a direction 66 as a segment 64 limited by the tear line 62. A thus accelerated segment 64 from the layer 30 can here be positioned on a substrate opposite to the layer 30, the said substrate being aligned in a defined manner relative to the layer 30 and the carrier 40, as represented in FIG. 1, the segment 64 undergoing fixing to the substrate 70 due to its great impact energy on impinging on to the substrate 70.

Figure 3:
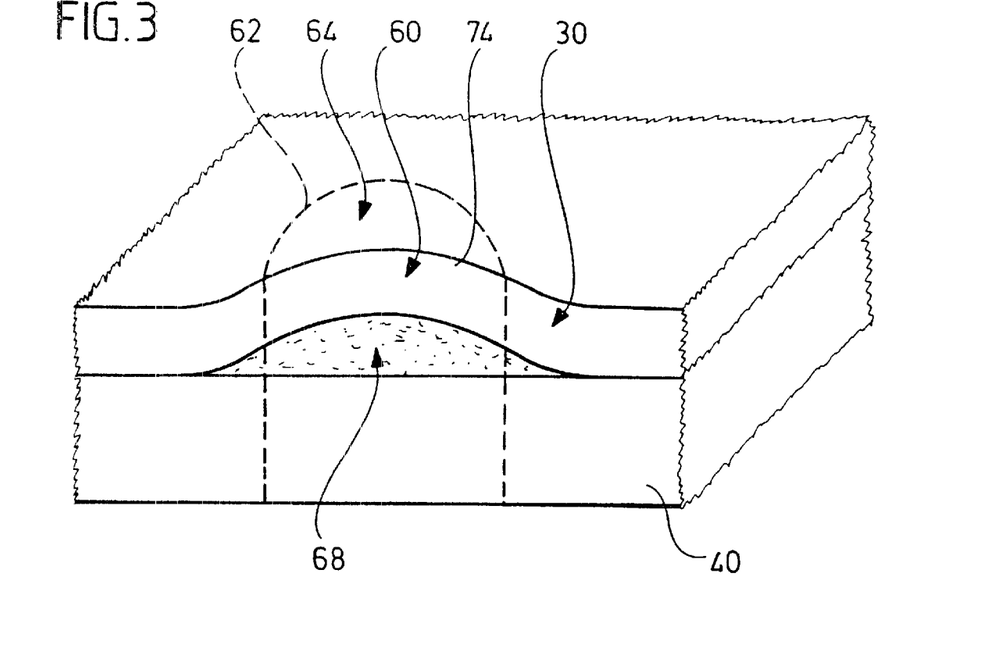
FIG. 3 A diagrammatic representation of an incipient phase of detachment of a solid, cohesive partial layer corresponding to the method according to the invention.
Figure 4:
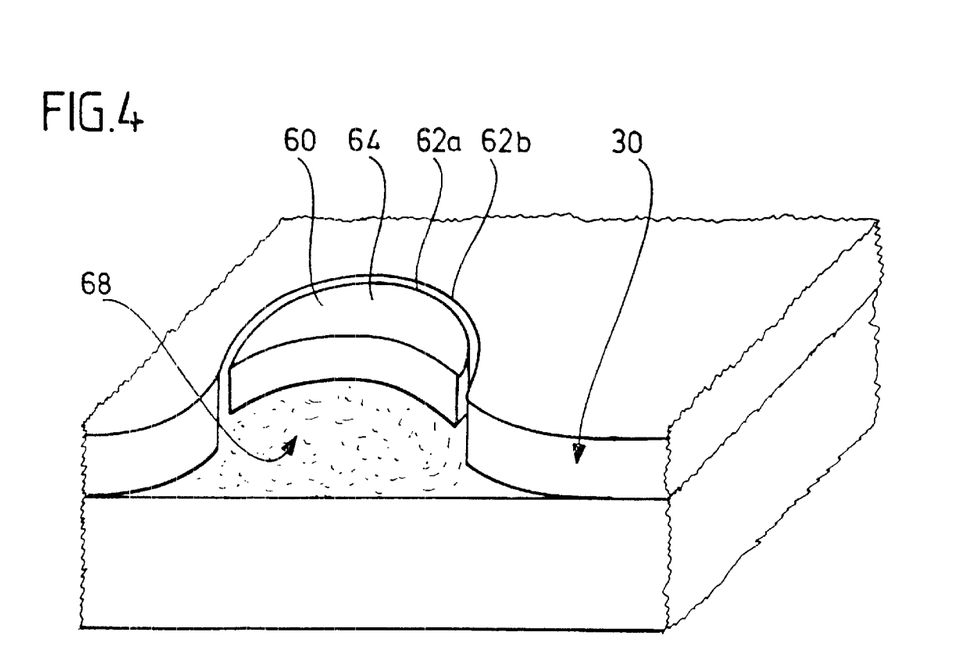
FIG. 4 A diagrammatic representation of a completed phase of detachment of the partial layer arising according to the invention in the first embodiment of the method according to the invention.

Formation of the segment 64 during detachment of the partial layer 60 from the surrounding layer 30 preferably takes place, as depicted in FIGS. 3 and 4, by enlargement of the volume of superheated matter in the partial layer volume 50 with formation of a bubble-like hollow space 68 beneath the partial layer 60 with the result that the partial layer 60 is increasingly lifted from the carrier 40 over a distance which is greater than the thickness TD of the partial layer volume 50, the partial layer 60 preferably arching convexly relative to the carrier 40 and in the region of the later tear line 62 blends into the surrounding layer 30 still with a firm transition zone 74 (FIG. 3). When the hollow space 68 is further enlarged, tearing occurs in the region of the tear line 62, with the formation of two tearing edges spaced apart from one another, namely tearing edge 62a of segment 64 and tearing edge 62b of the surrounding layer 30, with the result that the segment 64 can then be freely accelerated in its entirety in the direction of the substrate 70 (FIG. 4).

Figure 5:
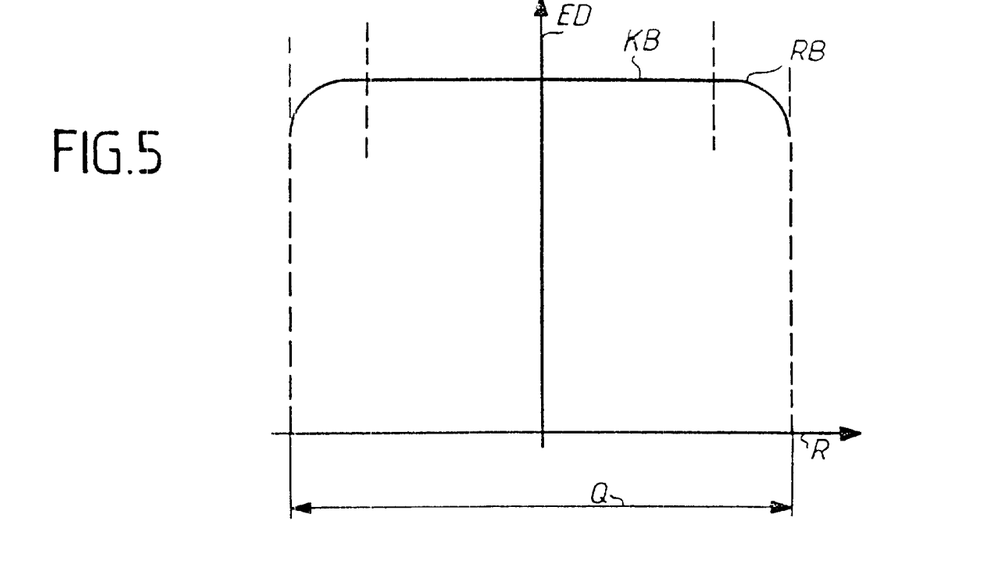
FIG. 5 A diagrammatic representation of a distribution of the energy density in the first embodiment of the method according to the invention.

In order to achieve heating of the partial layer volume 50 as evenly as possible, it is preferably envisaged that the laser beam 16, as depicted in FIG. 5, shows a distribution of the energy density in the radial direction R relative to its optical axis over a range which is substantially constant in a core region KB, within a marginal region RB, with the result that heating of the material in the partial layer volume 50 is even over substantially the whole beam cross-section Q of the laser pulse 16 and thus the partial layer volume 50 similarly extends into the layer 30 substantially over the whole beam cross-section Q with thickness TD, as depicted in FIG. 2.

It is especially advantageous if the core region KB extends substantially over the whole beam cross-section Q and the marginal region RB, in which there is a deviation from a substantially constant course of the energy density, is as small as possible.

Figure 6:
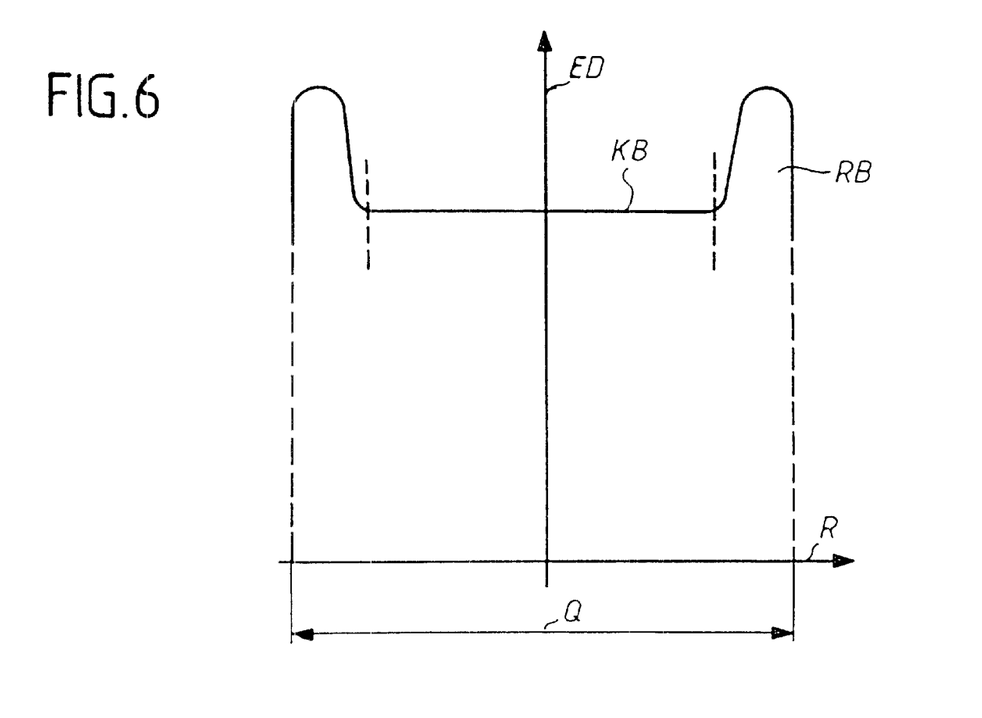
FIG. 6 A diagrammatic representation of a distribution of the energy density in the second embodiment of the method according to the invention.

In a second embodiment of a method according to the invention, depicted in FIG. 6, especially when detachment of the segment 64 along the tear line 62 is to be made easier, it is preferably envisaged that the energy density ED in the core region KB is similarly substantially constant, but the energy density ED in the marginal region RB is higher than the energy density in the core region KB, with the result that the partial layer volume 50 close to the tear line 62 is exposed to a higher hydrodynamic pressure, so that tearing and thus also the formation of the tearing edges 62a and 62b occurs more rapidly along the tear line 62.

In a third embodiment of a method according to the invention, instead of a continuous layer 30 on the carrier 40, the layer 30' is already structured into individual segments 64, with the result that tearing of the partial layer 60 from the surrounding layer 30 along the tear line 62 is no longer necessary, but each segment 64 is already defined by an edging 62a'.

Figure 7:
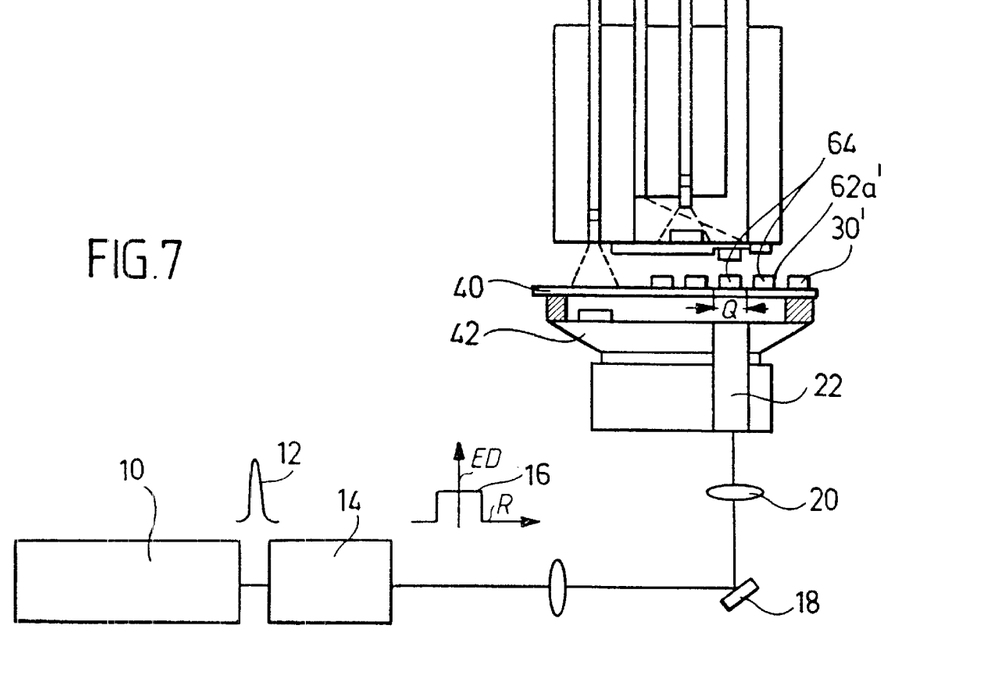
FIG. 7 A diagrammatic representation of a device similar to FIG. 1 for performing a third embodiment of the method according to the invention.
Figure 8:
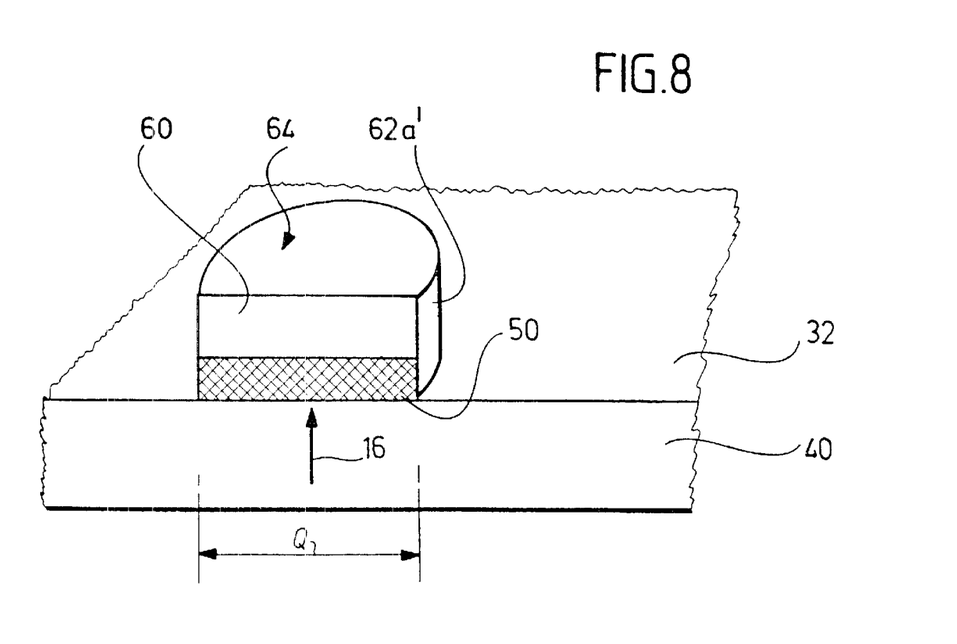
FIG. 8 A diagrammatic representation, similar to FIG. 2, of a pre-structured segment from the layer in the third embodiment of the method according to the invention.

As depicted in FIGS. 7 and 8, a segment 64 of this type is now positioned in such a way relative to the holder 42 that the segment 64 with its edging 62a' is within the beam cross-section Q and thus in the particular segment 64, for the purpose of detaching the partial layer 64, the partial layer volume 50 is heated by the laser pulse 16 to produce the superheated matter, in association with which, in a way similar to that described for the preceding embodiments, acceleration of the partial layer 60 occurs due to hydrodynamic expansion of the partial layer volume 50, this being unlimited in the direction of the layer plane 32, from which however no disadvantages in respect of acceleration of the partial layer 16 occur on account of the short action time of the laser pulse 16. In particular in this embodiment the pulse duration of the laser pulse 16 is reduced to pulse durations of less than 20 picoseconds, by which the partial layer 60 undergoes adequately great acceleration.

In this embodiment, the course of the energy density ED within the beam cross-section Q is preferably selected as in the first embodiment, the core region KB, measured over the whole beam cross-section Q, extending as depicted in FIG. 5.

Furthermore the laser 10 and the beam-forming lens 14 in the third embodiment are designed in the same way as in the first embodiment.

A beam-forming lens 14 for achieving a defined distribution of the energy density ED within the beam cross-section Q is described, for example, in the journal Optics Communications, Vol. 48, No. 1, Nov. 1, 1983, pages 44–46 in the paper of Kawamura et al. or in Optics Communications, Vol. 36, No. 6, Mar. 15, 1981, pages 469 to 471, by Wai Hon Lee. A further description of a beam-forming lens 14 to obtain a defined distribution of the energy density may be found in the journal Applied Optics, Vol. 35, No. 20, dated Jul. 10, 1996, pages 3807 to 3814 in the article by Jörgen Bengtsson.

Especially advantageously, when the substrate is held by a gripping device 80 (FIG. 1) and the gripping device 80 and the holder 42 are members of a device for performing operating stages in miniaturised structural modules, such as for example described in German Patent Application P 198 23 196.2-14 the substrate 70 can be positioned relatively to the carrier 40.

Figure 9:
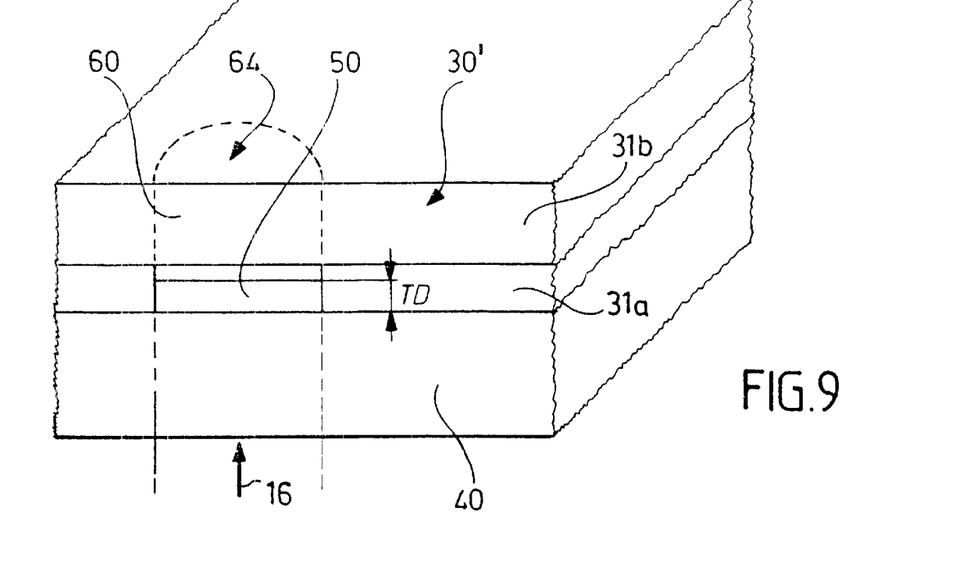
FIG. 9 A diagrammatic representation, similar to FIG. 2, of a structure of a material layer for a fourth embodiment of the method according to the invention.

In a fourth embodiment of the method according to the invention, as depicted for example in FIG. 9, the material layer 30' is composed of two sub-layers 31a and 31b, sub-layer 31a, which buts directly against the carrier 40, being provided as for the formation of the partial layer volume 50; i.e. sub-layer 31a is manufactured from a material in which the laser pulse 16 is strongly absorbed, with the result that, advantageously, the partial layer volume 50 with the superheated matter can form in this sub-layer 31a and extends only within the sub-layer 31a substantially to the depth TD, with the result that the sub-layer 31b, which is disposed on the side of the sub-layer 31a opposite to the carrier 40, may be composed of another material which then, following detachment of the segment 64, forms the solid, cohesive partial layer 60.

The sub-layer 31b can preferably be made from the desired material to be deposited.

In other respects, the method according to the fifth embodiment operates in the same way as in the first embodiment, with the result that as regards the other aspects of the embodiments, the content of the first embodiment may be referred to in full.

Figure 10:
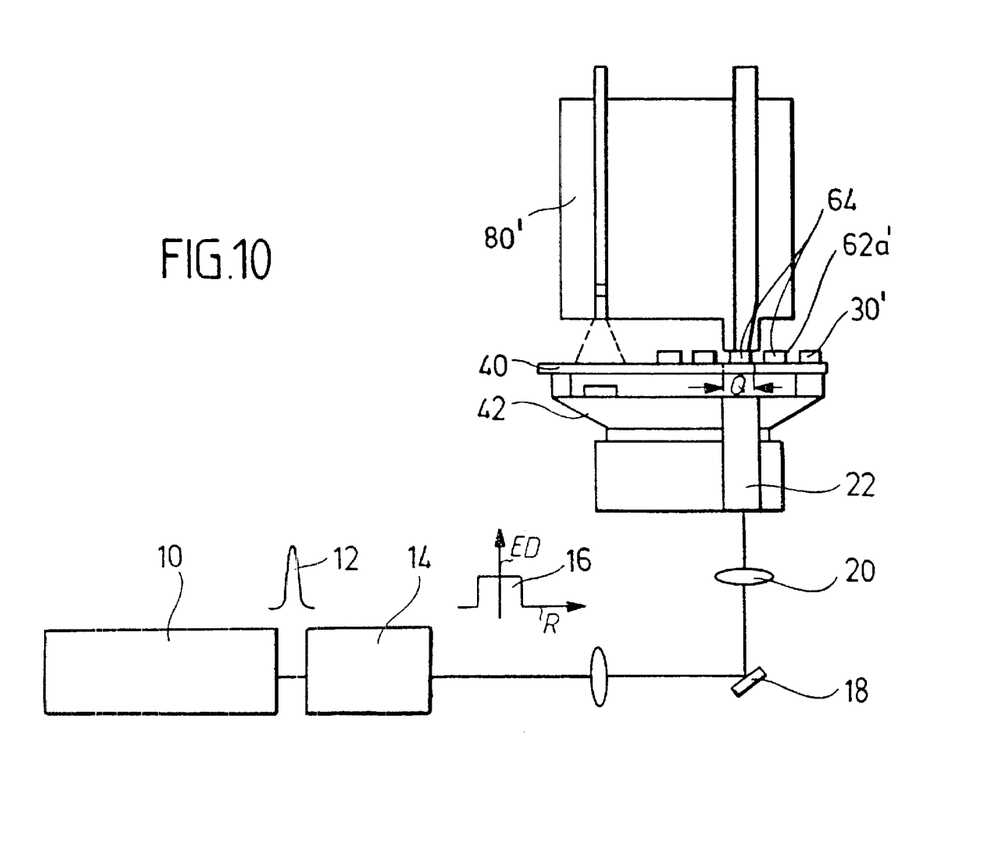
FIG. 10 A diagrammatic representation of a device similar to FIG. 7 for a fifth embodiment of the method according to the invention.

In a fifth embodiment of the method according to the invention, depicted in FIG. 10, no deposition of the segment 64 on a substrate occurs, rather the segment 64 is removed from a gripping device 80' immediately after detachment from the carrier 40 and transported to the desired point of use.

In other respects the method and the device for performing the method in the fifth embodiment are identical to those of the fourth embodiment, with the result that in this regard the content of the embodiments may be referred to in full.

Figure 11:
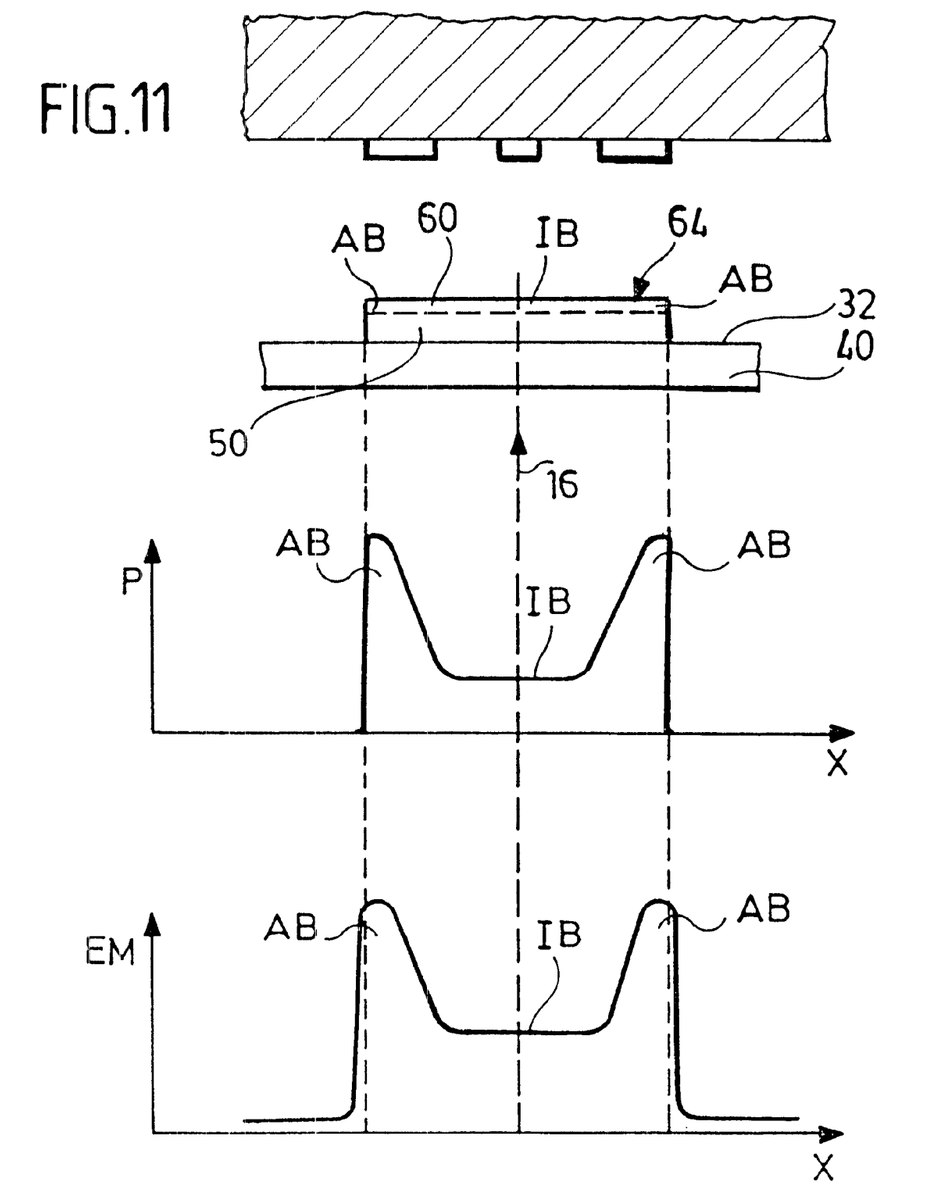
FIG. 11 A diagrammatic representation of an embodiment of the method according to the invention with an energy quantity varying locally over the beam cross-section of the laser pulse and supplied by a laser pulse.

An especially advantageous variant of the method according to the invention, depicted in FIG. 11, is based on a pre-structured segment 64 corresponding to FIG. 8, which is disposed on a carrier 40 and is movable away from the carrier 40 by the laser pulse 16. In this arrangement, either by means of a locally varying energy density and/or a locally varying pulse duration, the laser pulse 16 produces a distribution of the energy quantity EM supplied by the said laser pulse over the space co-ordinate x, which is high in the outer regions AB and lower in an inner region IB with the consequence that, within the partial layer volume 50, due to the laser pulse 16 the superheated matter in a state of thermodynamic non-equilibrium and of a density similar to the solid state exhibits a pressure distribution P over the space co-ordinate x which is similarly high in outer regions AB and low in an inner region IB. The partial layer 60 is thereby more strongly accelerated in the outer regions than in the inner region IB so that when the partial layer 60 is detached, it is permanently deformed to the extent that the outer regions AB opposite the inner region IB are bent away from the carrier 40.

Figure 12:
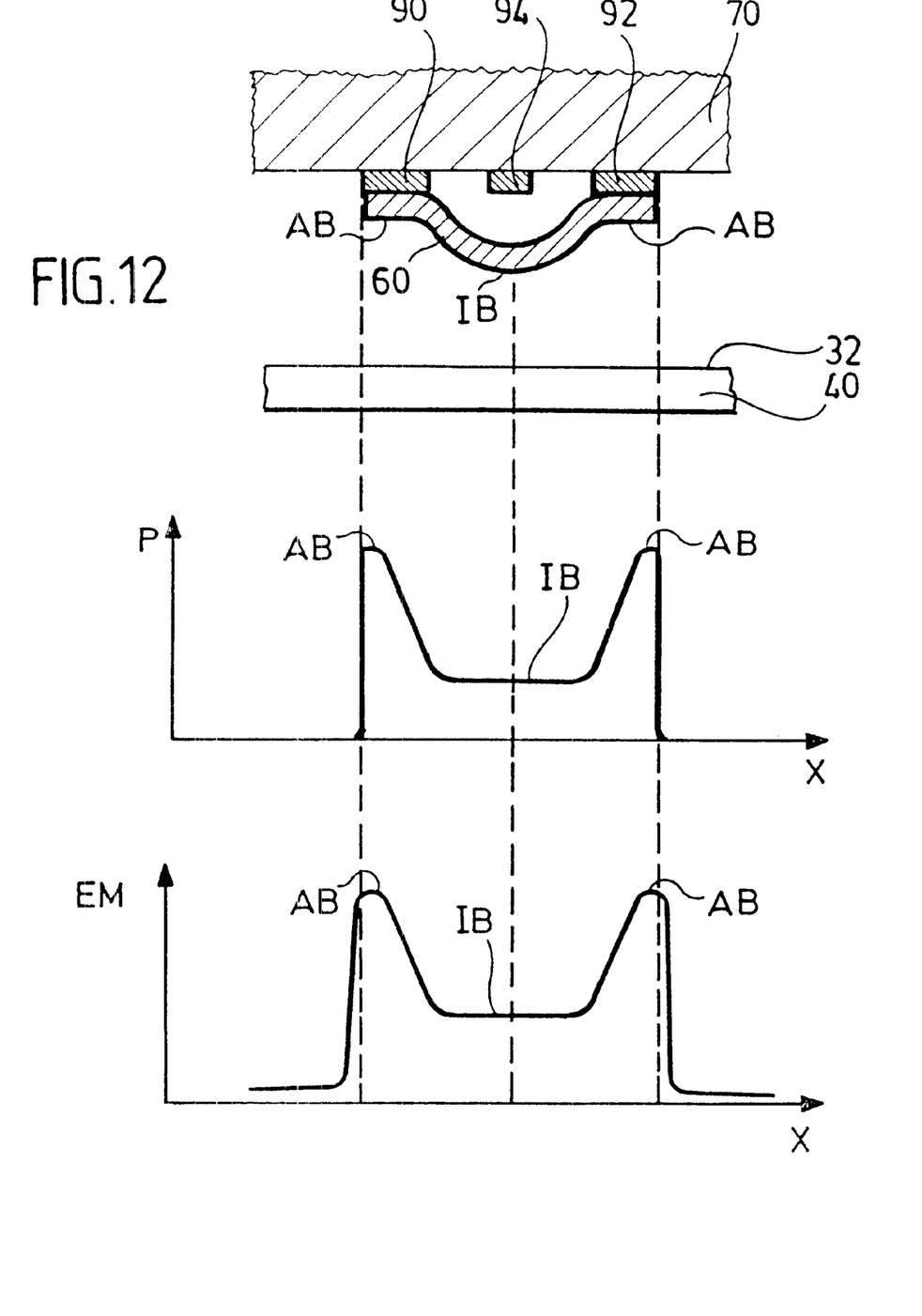
FIG. 12 A diagrammatic representation of the deformation of the partial layer achievable with the laser pulse according to FIG. 11.
Figure 13:
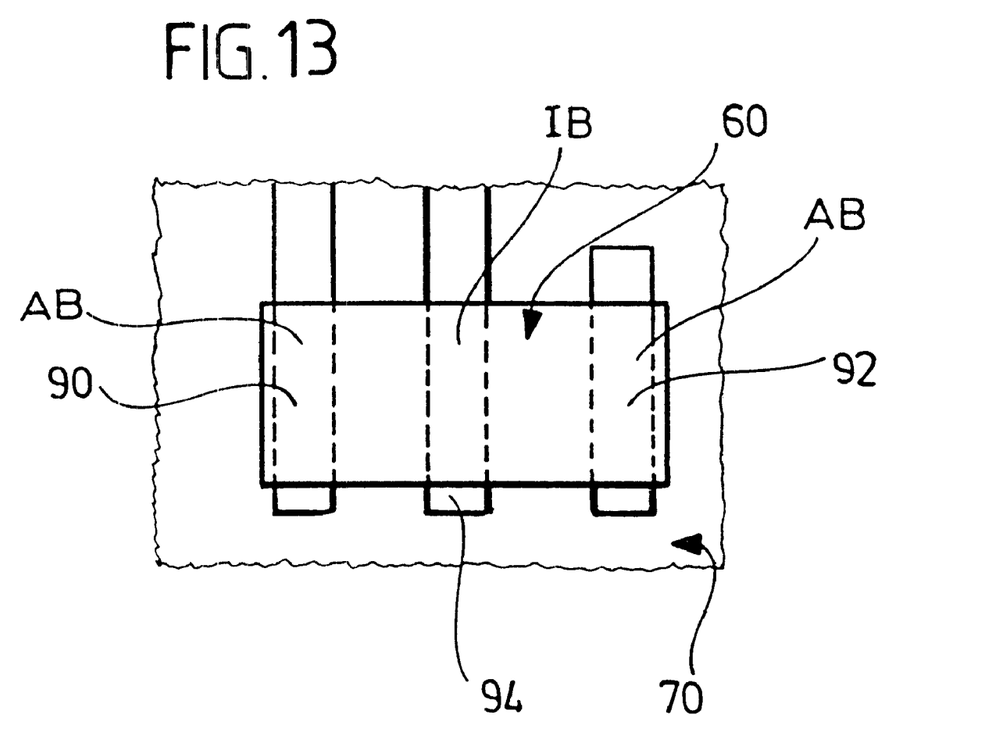
FIG. 13 A top view of the substrate with the deformed partial layer.

In this configuration, acceleration of the partial layer 60 in the direction of the substrate 70 opposite to the carrier 40 occurs, as depicted in FIG. 12 the outer regions AB being laid on the substrate for example on already prepared supports 90 and 92, the supports 90 and 92 being designed for example as electrical strip conductors.

On account of the permanent deformation of the partial layer 60, its inner region IB arches over a conducting strip 94 laid for example similarly upon the substrate 70, the conducting strip 94 being disposed between the supports 90 and 92. A capacitance thereby arises between the conducting strip 94 and the inner region IB of the partial layer 60, which arches away over the said partial layer, with the result that with this the possibility arises of creating a capacitance on the substrate 70 through the partial layer 60.

Figure 14:
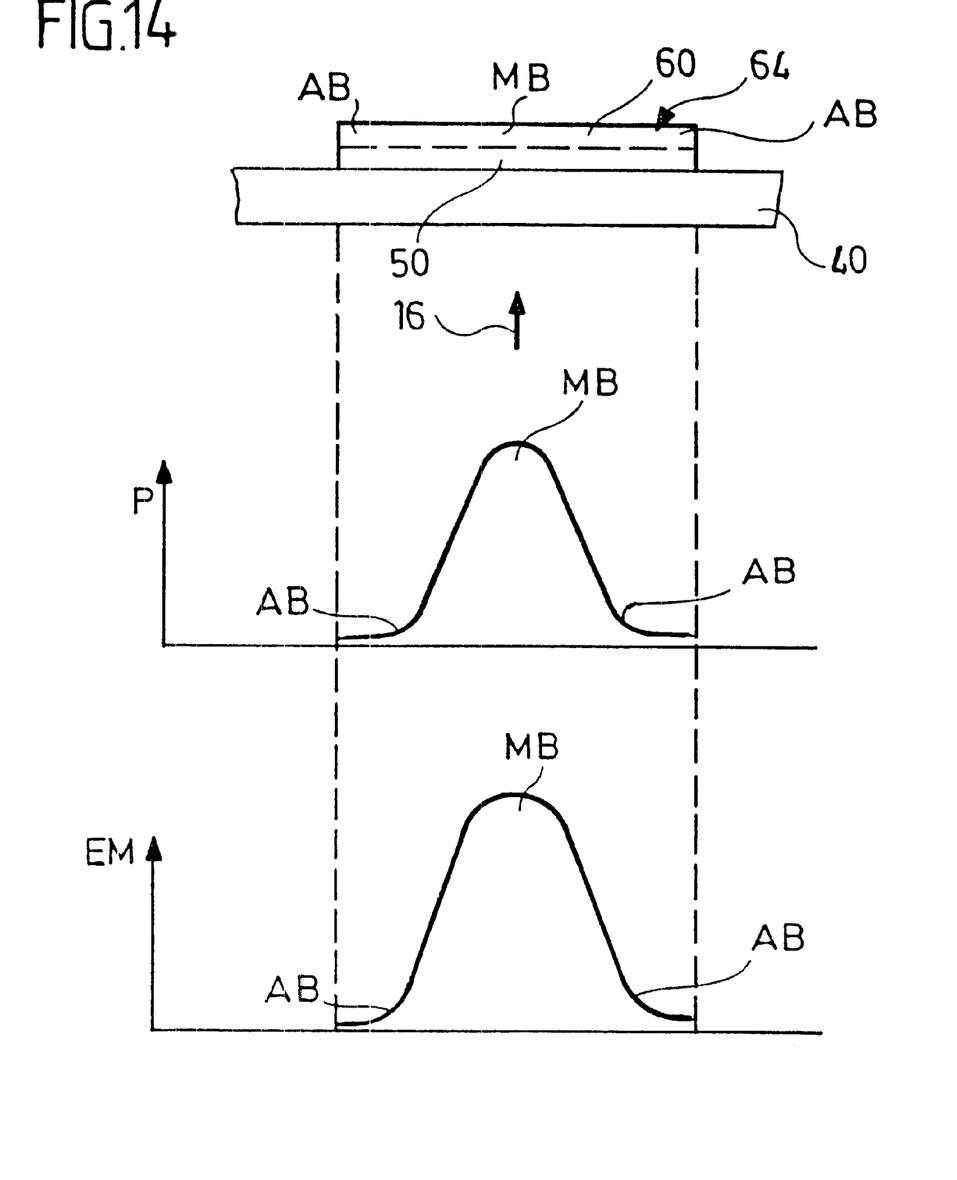
FIG. 14 A further embodiment of a method according to the invention with another type of variation of the energy quantity supplied by the laser pulse over its beam cross-section.
Figure 15:
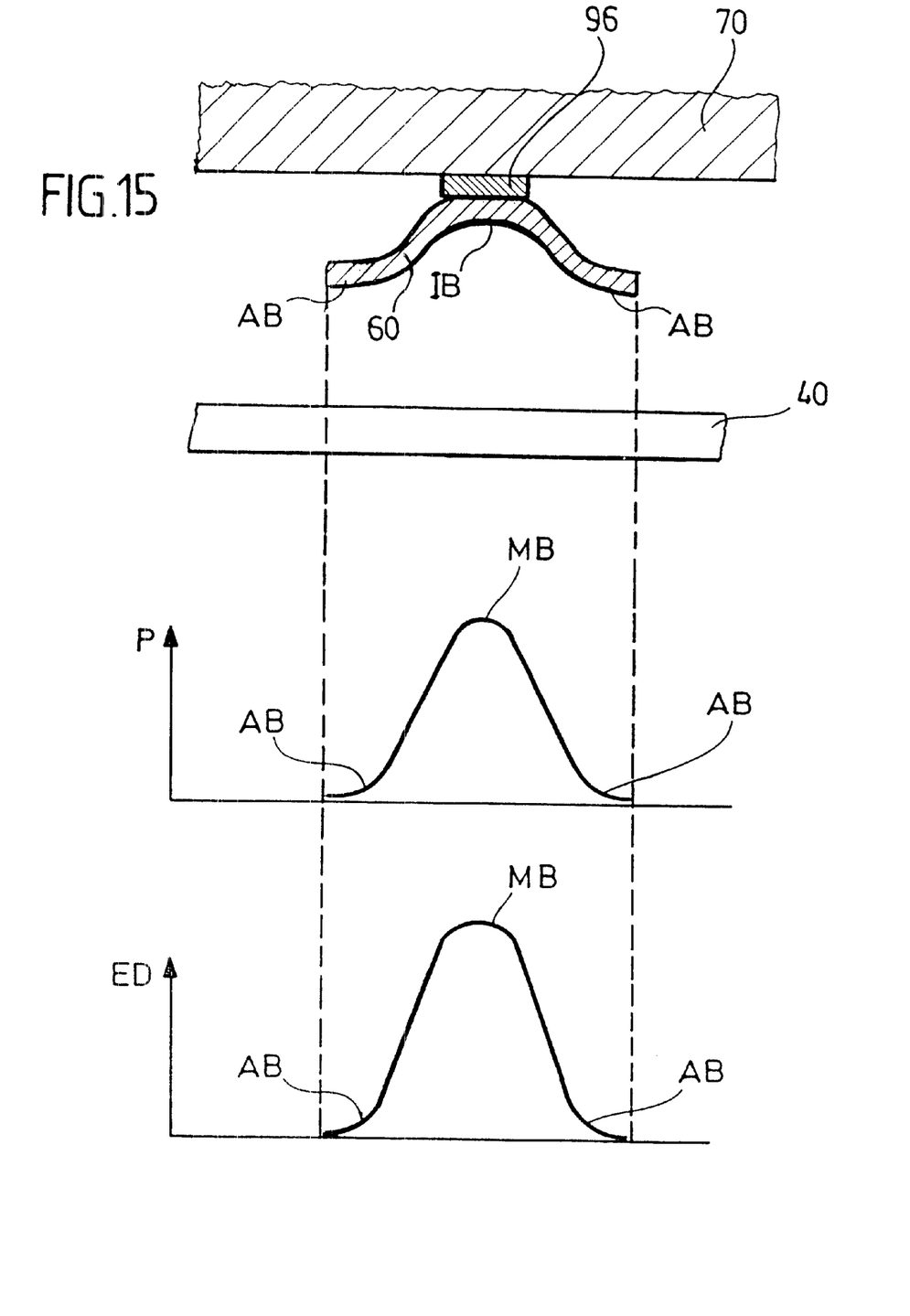
FIG. 15 A diagrammatic representation of the deformation of the partial layer achievable by this means.

In an alternative approach depicted in FIG. 14, for example the distribution of the energy quantity EM of the laser pulse 16 is selected in such a way that the energy quantity EM is maximal in the middle region MB, while in the outer regions AB it is lower. In the partial layer volume 50 this leads to a distribution of the arising pressure P that is also displayed in FIG. 14 and reveals higher pressure in the middle region MB than in the outer regions AB, resulting in the partial layer 60 being more strongly accelerated in the direction of the substrate 70 with its middle region MB than with the outer regions AB and, as depicted in FIG. 15, in its middle region MB consequently arching away from the outer regions AB of the carrier 40. Thereby for example the partial layer 60 can be fixed with the middle region on a support 96 on the substrate 70 and thus with its outer regions AB exhibits elastic "wings", with the result that the partial layer 60 may for example be used as a spring contact.

Figure 16:
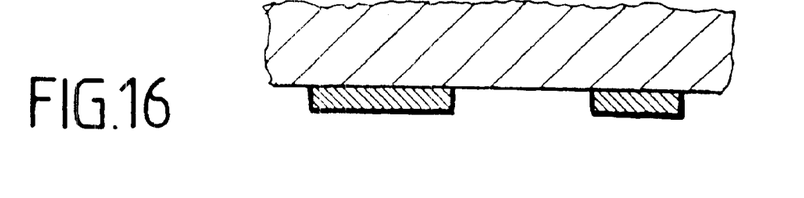
FIG. 16 A representation of another embodiment of a method according to the invention with yet another type of local variation of the energy quantity supplied by the laser pulse over the beam cross-section of the laser pulse and FIG. 17 A diagrammatic representation of the deformation of the partial layer obtainable with an energy density of this type.
Figure 17:
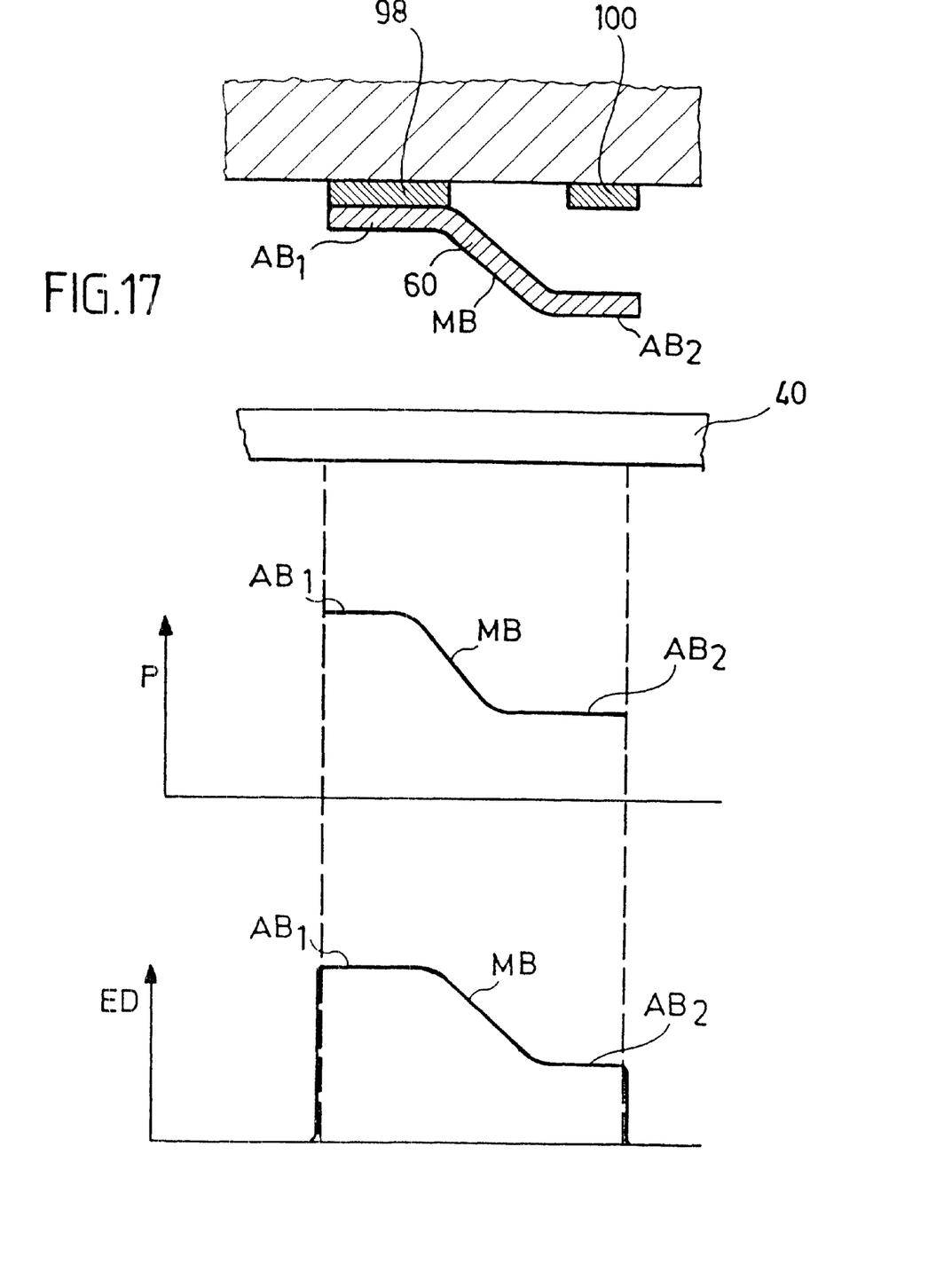

In a further embodiment depicted in FIG. 16, the energy-quantity distribution EM in a first outer region $AB_1$ is higher than in an outer region $AB_2$ opposite, whereas in the middle region MB a transition from the energy quantity at $AB_1$ to the energy quantity at $AB_2$ occurs. This leads to a corresponding course of the pressure P in the partial layer volume 50 and the partial layer 60 is consequently accelerated more strongly from the carrier 40 in the first outer region $AB_1$ than in the second outer region $AB_2$ and a permanent deformation of the partial layer 60 consequently occurs, as depicted in FIG. 17, the said partial layer 60 lying on a first support with the outer region $AB_1$ and fixed, while being disposed at a distance over a second support 100 with its second outer region $AB_2$.

Thus, with its proud-standing part pointing as far as the second outer region $AB_2$, the partial layer 60 fixed with its first outer region $AB_1$ on the support 98 forms a spring contact over the second support 100, which may be brought into contact with the said part for example by impingement in the direction of the support 100, in order for example to produce an electrical contact between these two.

What is claimed is:

1. A method of detaching a solid partial layer arranged within a segment of a material layer disposed on a carrier from said material layer, said material layer extending in a layer plane and having a specific layer thickness, by means of a laser pulse passing through the carrier, wherein:

the laser pulse produces superheated matter within a partial layer volume of said segment, said partial layer volume abuts against the carrier, lies within an extent of a beam cross-section of the laser pulse and extends transversely to the layer plane via a part of the layer thickness, said superheated matter produced by the laser pulse has a density at density values similar to density values of the solid state and is in a state of thermodynamic non-equilibrium, and said superheated matter expands and accelerates a cohesive, solid partial layer remaining in the segment after formation of said superheated matter in said partial layer volume on a side of the partial layer volume opposite to the carrier, in order to detach the partial layer from the material layer.

2. A method according to claim 1, wherein, at least initially, material of the material layer within said partial layer volume is present in the superheated matter substantially unchanged.

3. A method according to claim 1, wherein the superheated matter from material of the material layer within said partial layer volume expands substantially stoichiometrically during detachment of the segment.

4. A method according to claim 1, wherein detachment of said cohesive, solid partial layer is performed with a single laser pulse.

5. A method according to claim 1, wherein the cohesive, solid partial layer is accelerated away from the carrier by hydrodynamic expansion of the superheated matter in the partial layer volume.

6. A method according to claim 5, wherein the cohesive, solid partial layer is accelerated in the direction of a substrate.

7. A method according to claim 6, wherein the cohesive, solid partial layer is fixed on the substrate.

8. A method according to claim 7, wherein energy of impact of the cohesive, solid partial layer on the substrate leads to fixing on the substrate.

9. A method according to claim 8, wherein the substrate is positioned at a defined distance from the carrier at which fixing of the cohesive, solid partial layer on the substrate occurs due to impact.

10. A method according to claim 8, wherein the size of the beam cross-section is selected so that the impact energy leads to said fixing of said cohesive, solid partial layer on the substrate.

11. A method according to claim 8, wherein the energy of the laser pulse is selected so that the impact energy leads to said fixing of said cohesive, solid partial layer on the substrate.

12. A method according to claim 8, wherein the pulse duration of the laser pulse is selected so that the impact energy leads to said fixing of said cohesive, solid partial layer on the substrate.

13. A method according to claim 1, wherein the detached cohesive, solid partial layer after being detached from said material layer is removed by a remover.

14. A method according to claim 1, wherein the pulse duration of the laser pulse is determined in such a way that the partial layer volume extends transversely to the plane of the layer over a thermal penetration depth of electrons heated during the pulse duration of the laser pulse.

15. A method according to claim 1, wherein the pulse duration of the laser pulse is smaller than the material-dependent thermal relaxation time of electrons of the material.

16. A method according to claim 1, wherein the pulse duration of the laser pulse is shorter than 50 picoseconds.

17. A method according to claim 15, wherein the material layer is selected so that the laser pulse couples to free electrons of the material of the material layer.

18. A method according to claim 15, wherein the material layer is selected so that the laser pulse itself produces the electrons necessary for coupling by means of multiple photon absorption in the material layer.

19. A method according to claim 15, wherein the material layer is selected so that the laser pulse itself produces the electrons necessary for coupling by means of an avalanche breakdown in the material layer.

20. A method according to claim 1, wherein the local energy density of the laser pulse within a core region of the beam cross-section exhibits values of the same order of magnitude.

21. A method according to claim 1, wherein values of the energy density of the laser pulse in at least one marginal region outside a core region of the beam cross-section are higher than values of energy density within the core region, said at least one marginal region defining at least part of a shape of said solid partial layer to be detached.

22. A method according to claim 21, wherein the values of the energy density in all marginal regions around the whole core region are elevated by comparison with the values of energy density in the core region.

23. A method according to claim 1, wherein the segment is pre-structured in order to define a shape of said cohesive, solid partial layer to be detached prior to detachment of said cohesive, solid partial layer with the laser pulse.

24. A method according to claim 1, wherein the material layer comprises a plurality of layers.

25. A method according to claim 1, wherein the material layer has a sub-layer intended for forming the partial layer volume.

26. A method according to claim 1, wherein the detached solid partial layer is permanently deformed in the course of being detached from said material layer by a defined variation of energy supplied by the laser pulse to individual regions of the partial layer volume.

27. A method according to claim 26, wherein the partial layer is deposited on a substrate as a permanently formed component.

28. A method according to claim 27, wherein the partial layer is fixed on the substrate only at partial regions of said partial layer.

* * * * *